United States Patent
Kastl et al.

(10) Patent No.: US 7,545,080 B2
(45) Date of Patent: Jun. 9, 2009

(54) MONOLITHIC PIEZOACTUATOR WITH ROTATION OF THE POLARISATION IN THE TRANSITION REGION AND USE OF SAID PIEZOACTUATOR

(75) Inventors: Harald Johannes Kastl, Fichtelberg (DE); Andreas Lenk, Bannewitz Ot Possendorf (DE); Carsten Schuh, Baldham (DE); Claus Zumstrull, Regenstauf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/996,573

(22) PCT Filed: Jul. 26, 2006

(86) PCT No.: PCT/EP2006/064682

§ 371 (c)(1),
(2), (4) Date: Feb. 21, 2008

(87) PCT Pub. No.: WO2007/012654

PCT Pub. Date: Feb. 1, 2007

(65) Prior Publication Data
US 2008/0203857 A1 Aug. 28, 2008

(30) Foreign Application Priority Data
Jul. 26, 2005 (DE) .................. 10 2005 034 814

(51) Int. Cl.
*H01L 41/08* (2006.01)
(52) U.S. Cl. .................. 310/328; 310/358; 310/359
(58) Field of Classification Search .................. 310/328, 310/366, 358, 359
See application file for complete search history.

(56) References Cited

U.S. PATENT DOCUMENTS

| 6,888,290 | B2* | 5/2005 | Murai et al. | 310/328 |
| 7,042,143 | B2* | 5/2006 | Bindig et al. | 310/366 |
| 7,225,514 | B2 | 6/2007 | Iwase et al. | 29/25.35 |

(Continued)

FOREIGN PATENT DOCUMENTS

DE 19928178 6/1999

(Continued)

OTHER PUBLICATIONS

International Search Report; PCT/EP2006/064682; pp. 2, Nov. 7, 2006.

*Primary Examiner*—Mark Budd
(74) *Attorney, Agent, or Firm*—King & Spalding L.L.P.

(57) ABSTRACT

A piezoactuator has at least one piezoelectric-active partial stack with piezoceramic layers arranged one over the other with piezoceramic material and electrode layers arranged between the piezoceramic layers, at least one piezoelectric-inactive terminating region arranged over the partial stack and at least one transition region between the partial stack and the terminating region, the partial stack, the terminating region and the transition region all connected together to give a monolithic complete stack. The transition region has a transition region stack with piezoceramic layers arranged one over the other and electrode layers arranged between the piezoceramic layers both have a form and are arranged on each other such that, in the stack direction of the transition region stack, from piezoceramic layer to piezoceramic layer there is a successive rotation about a main axis of the polarity and/or a rotation of the main axis of the electric control is provided.

11 Claims, 2 Drawing Sheets

U.S. PATENT DOCUMENTS

2004/0255443 A1  12/2004  Iwase et al. ................. 29/25.35
2006/0238073 A1  10/2006  Ragossnig et al. .......... 310/328

FOREIGN PATENT DOCUMENTS

| DE | 10307825 | 2/2003 |
| DE | 102004012282 | 3/2004 |
| DE | 102004026572 | 6/2004 |

* cited by examiner

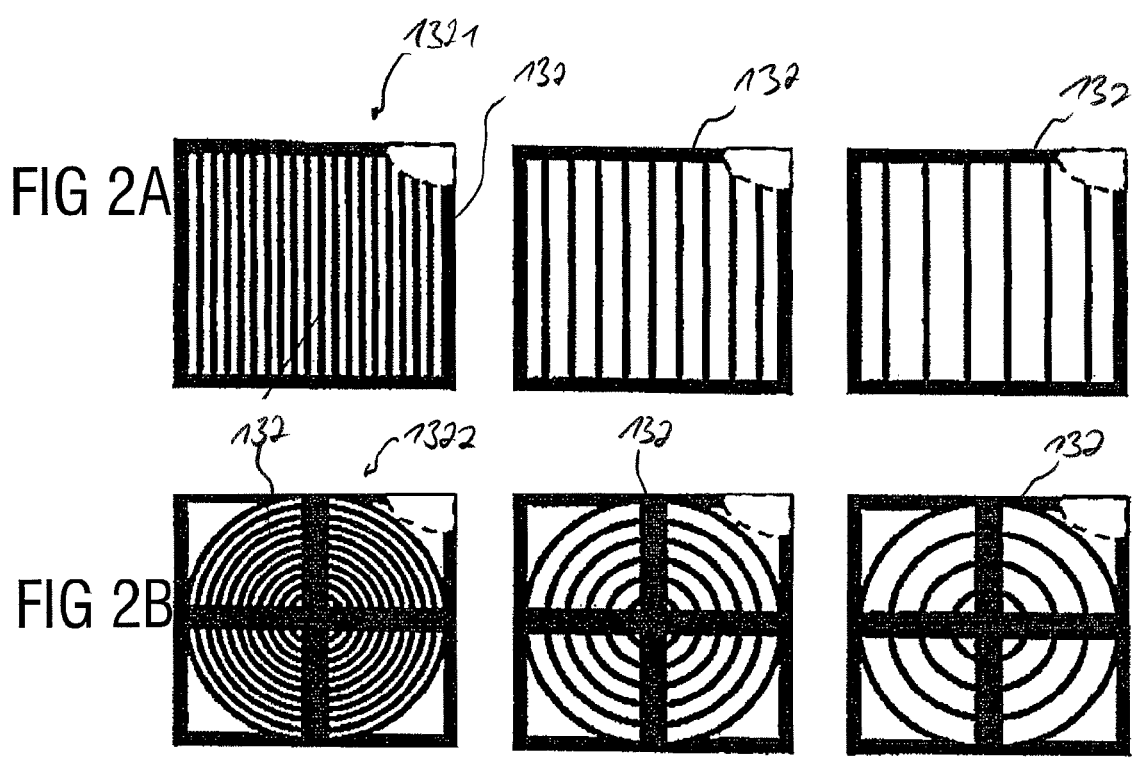

MONOLITHIC PIEZOACTUATOR WITH ROTATION OF THE POLARISATION IN THE TRANSITION REGION AND USE OF SAID PIEZOACTUATOR

CROSS-REFERENCE TO RELATED APPLICATIONS

This application is a U.S. national stage application of International Application No. PCT/EP2006/064682 filed Jul. 26, 2006, which designates the United States of America, and claims priority to German application number 10 2005 034 814.9 filed Jul. 26, 2005, the contents of which are herby incorporated by reference in their entirety.

TECHNICAL FIELD

The invention relates to a piezoactuator with a monolithic multi-layered construction, comprising at least one piezoelectric active partial stack, with the partial stack comprising piezoceramic layers arranged one over the other made of piezoceramic material and electrode layers (internal electrodes) arranged between the piezoceramic layers, at least one piezoelectric inactive terminating region arranged above the piezoelectric active partial stack and at least one transition region arranged between the piezoelectric active partial stack and the terminating region, with the piezoelectric active partial stack, the terminating region and the transition region being joined to form a monolithic total stack. The use of the piezoactuator is specified in addition to the piezoactuator.

BACKGROUND

Poling of the piezoceramic material occurs when such piezoactuators are operated by an electrical signal into the large signal range for the first time (field strengths of several kV/mm). This results in an irreversible change in length, which is known as the remnant strain. Tensile stresses arise in the total stack as a result of the remnant strain and because of an additional strain that occurs when an electrical signal is applied to the electrode during operation of the piezoactuator. These tensile stresses cause cracks (poling cracks) to appear during the poling process or during operation of the piezoactuator, for instance along an interface between a piezoceramic layer and an electrode layer. Such cracks also arise in particular in the transition region between the active partial stack and the terminating region. Branching cracks or cracks which propagate in the longitudinal direction of the total stack are particularly harmful here. Such cracks inevitably result in a premature failure of the piezoactuator.

SUMMARY

There exists a need to reduce the likelihood of the formation and growth of the cracks described above.

According to an embodiment, a piezoactuator with a monolithic multi-layered construction, may comprise at least one piezoelectric active partial stack, wherein the partial stack comprising piezoceramic layers arranged one above the other and electrode layers arranged between the piezoceramic layers, at least one piezoelectric inactive terminating region arranged above the piezoelectric active partial stack and at least one transition region arranged between the piezoelectric active partial stack and the terminating region, wherein the piezoelectric active partial stack, the terminating region and the transition region are connected with one another to form a monolithic total stack, and wherein the transition region comprises a transition region stack with transition region piezoceramic layers arranged one above the other and transition region electrode layers arranged between the transition region piezoceramic layers and the transition region piezoceramic layers and the transition region electrode layers being in a form and arranged on one another such that from transition region piezoceramic layer to transition region piezoceramic layer in the stack direction of the transition region, there is a rotation of a main axis of the poling vector and/or a rotation of a main axis of the electrical drive.

According to a further embodiment, the main axis in the boundary region between the transition region partial stack and the piezoelectric active partial stack essentially may be aligned in parallel to the stack direction of the transition region partial stack. According to a further embodiment, the rotation is caused by a change in the structure and/or a dimension of the transition region electrode layers. According to a further embodiment, the structure parallel to the lateral dimension of the respective transition region electrode layer may be formed like a comb. According to a further embodiment, the structure parallel to the lateral dimension of the respective transition region electrode layer can be shaped like a ring. According to a further embodiment, adjacent transition region electrode layers may form an interdigital structure. According to a further embodiment, the active partial stack and/or the terminating region may comprise a partial stack height selected from the range 1 mm to 10 mm inclusive and in particular one from the range 3 mm to 5 mm inclusive. According to a further embodiment, the transition region partial stack may comprise a transition stack height selected from the range 0.2 mm to 5.0 mm inclusive and in particular from 0.5 mm to 2.0 mm inclusive. According to a further embodiment, the total stack may have a total stack height that is selected from the range 10 mm to 200 mm inclusive. According to a further embodiment, the piezoactuator may be used for operating a valve and in particular an injection valve of an internal combustion engine.

BRIEF DESCRIPTION OF THE DRAWINGS

The invention is described in more detail below with reference to a number of exemplary embodiments and the figures associated therewith. The figures are schematic diagrams and do not constitute drawings to scale.

FIG. 2A shows a successive change in the comb-like structure of the transition region electrode layers.

FIG. 2B shows a successive change in the ring-like structure of the transition region electrode layers.

DETAILED DESCRIPTION

Figure 1:
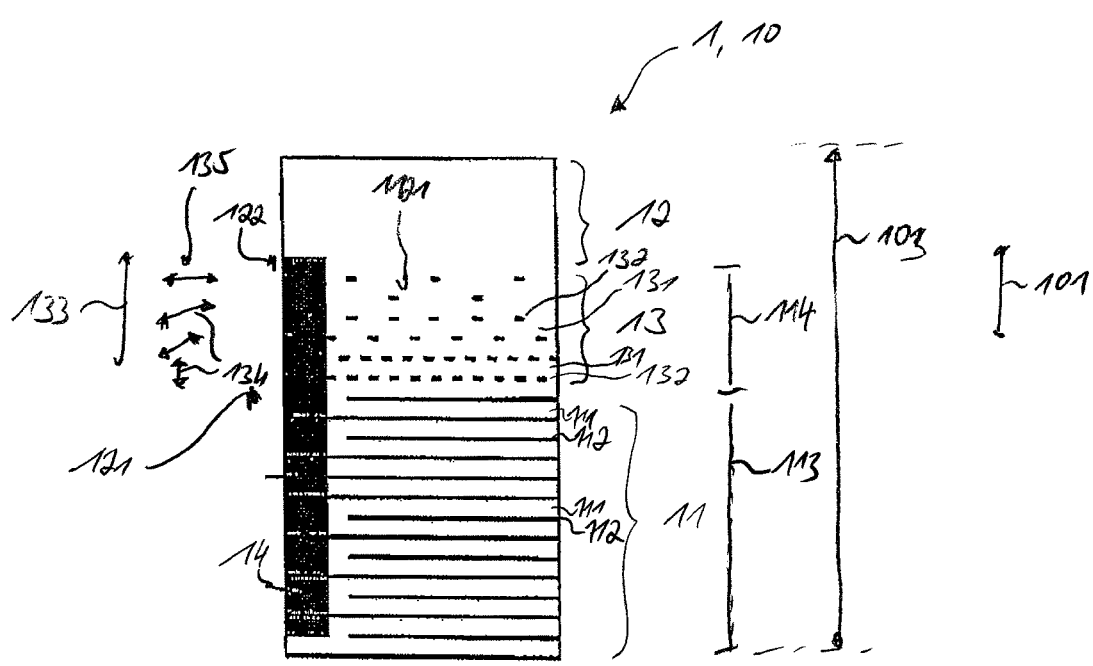
FIG. 1 shows a piezoactuator with a monolithic multi-layered construction viewed from the side.

As stated above, according to an embodiment, a piezoactuator with a monolithic multi-layered construction, comprises at least one piezoelectric active partial stack, with the partial stack comprising piezoceramic layers arranged one above the other and electrode layers arranged between the piezoceramic layers, at least one piezoelectric inactive terminating region arranged above the piezoelectric active partial stack and at least one transition region arranged between the piezoelectric active partial stack and the terminating region, with the piezoelectric active partial stack, the terminating region and the transition region being joined to form a monolithic total stack. The piezoactuator is characterized in that the transition region has a transition region stack with transition region piezoceramic layers arranged one above the other and transition region electrode layers arranged between the transition region piezoceramic layers and the transition region piezoceramic layers and the transition region electrode layers are in a form and are arranged on one another such that from transition region piezoceramic layer to transition region piezoceramic layer in the stack direction of the transition region stack, there is a successive rotation about a main axis of the poling vector and/or a rotation about a main axis of the electrical drive. The main axis relates to the polarization vector and/or the vector of the electrical field, which is induced by the electrical drive and is coupled in each instance into the transition region piezoceramic layer. Provision can be made here for the main axis of two or more piezoceramic layers which are stacked directly one above the other to be identically aligned. These piezoceramic layers form a packet of piezoceramic layers with an identically aligned main axis of the poling vector.

The terminating region can be a top or bottom region of the total stack. The terminating region may be composed of one layer or a number of layers. In the latter case, this is termed a cover packet. The terminating region can be made of ceramic materials or metals.

The main axis of the electrical drive defines the main axis of the electrical field, which is induced by the drive in the transition piezoceramic layer.

A piezoceramic material of the piezoceramic layers and a piezoceramic material of the transition region piezoceramic layers can be identical. Equally, however, different materials can be used. Likewise, the layer thicknesses of these layers can be identical or different.

According to various embodiments, a transition region is provided with gradation of the strain of the transition piezoceramic layers. Gradation allows the high tensile stresses known from the prior art between the piezoelectrically active partial stack and the piezoelectric inactive terminating region to be clearly reduced.

In accordance with a particular embodiment, the rotation of the respective main axis includes a rotation of the main axis from an alignment which runs essentially parallel to the stack direction of the transition region partial stack into an alignment which runs essentially at right angles to the stack direction of the transition region partial stack. This essentially means that precise vertical and/or parallel alignments do not necessarily have to exist. Deviations of up to 50% are conceivable.

The rotation effects a change in the strain that occurs during polarization or during operation. The resulting strain in the lateral direction (a/b direction) and the resulting strain in the stack direction (c-direction) are no longer composed purely of $d_{31}$ (negative) and $d_{33}$ (positive) components. A superimposition of these effects results. For certain directions of a poling vector and drive vector with respect to the layer planes, a minimum strain is achieved in the respective directions. This results in correspondingly low mechanical tensile stresses between two layers of the transition region.

The essentially vertical alignment in the boundary region is preferably arranged between the transition region partial stack and the terminating region. It results in successive "smudging" of the polarization. This results in only very minor mechanical stresses developing in the boundary region between the transition region and the inactive terminating region. The probability of a crack developing is significantly reduced.

In accordance with one particular embodiment, the rotation is induced by a change in a structure and/or dimension of the transition region electrode layers. The gradation is induced by a successive change in the transition region electrode layers.

To this end, the structure of the transition region electrode layer with respect to the lateral dimension of the respective transition region electrode layer is formed like a comb. In a further embodiment, the structure parallel to the lateral dimension of the respective transition region electrode layer is shaped like a ring. The comb-like structure is particularly suited to creating an interdigital structure. In accordance with a particular embodiment, adjacent transition region electrode layers thus form an interdigital structure.

In accordance with a particular embodiment, the active partial stack and/or the terminating region comprises a partial stack height selected from the range 1 mm to 10 mm inclusive, and in particular from the range 3 mm to 5 mm inclusive. The partial stack height is 2 mm for instance. This has shown that stress peaks are reduced very effectively using these partial stack heights. In accordance with a particular embodiment, the transition region partial stack has a transition stack height selected from the range 0.2 mm to 5.0 mm inclusive, and in particular from 0.5 mm to 2.0 mm inclusive. Very high total stacks can be achieved using the partial stacks. In a particular embodiment, the total stack has a total stack height that is selected from the range 10 mm to 200 mm inclusive. Higher total stack heights are also achievable.

This new, reliable piezoactuator is preferably used for operating a valve and in particular an injection valve of an internal combustion engine. The internal combustion engine is an engine of a motor vehicle for instance.

The piezoactuator 1 is a piezoactuator having a total stack 10 with a monolithic multi-layered construction. The piezoactuator 1 has a piezoelectric active partial stack 11 with piezoceramic layers 111 arranged alternately one above the other made of lead titanate zirconate (PZT) as a piezoceramic material and electrode layers 112 made of a silver palladium alloy.

A piezoelectric inactive terminating region 12 in the form of a ceramic cover packet made of ceramic layers is arranged above the piezoelectric active partial stack 11.

A transition region 13 in the form of a transition region stack is arranged between the piezoelectric active partial stack 11 and the cover packet 12. The transition region stack 13 has transition region piezoceramic layers 131 and transition region electrode layers 132 which are arranged alternately one above the other. The piezoceramic material of the transition region piezoceramic layers and the piezoceramic material of the piezoceramic layers of the piezoelectric active partial stack 11 are identical. In an alternative embodiment, the piezoceramic materials are different.

The piezoelectric active partial stack 11, the transition region stack 13 and the termination region 12 together form a monolithic total stack 10. An external metallization 14 to make electrical contact with the respective electrode layers is applied to a one side face of the total stack in the area of the active partial stack 11 and in the area of the transition region stack 11. A further external metallization (not shown) is provided to make contact with the alternating layers.

The overall height 103 of the total stack 10 in the stack direction 101 is 30 mm. The partial stack height 113 of the piezoelectric active partial stack 11 is approximately 10 mm. The transition region partial stack height 114 of the transition region stack 13 is approximately 2 mm.

The transition region piezoceramic layers 131 and the transition region electrode layers 132 are in a form and arranged on one another such that from transition region piezoceramic layer to transition region piezoceramic layer in the stack direction 133 of the transition region stack 13, there is a successive rotation 135 of the main axis 134 of the poling vector. Alternatively, there is a rotation 135 of the main axis 134 of the electrical drive.

The rotation 135 of the respective main axis 135 includes the rotation of the main axis 134 from an alignment which is essentially parallel to the stack direction 133 of the transition region partial stack 13 (in the boundary region 121 between the active partial stack 11 and the transition region stack 13) into an alignment (in the boundary region between the transition region stack 13) which is essentially at right angles to the stack direction 133 of the transition region partial stack 13 and the piezoelectric inactive cover packet 12.

In accordance with a first embodiment, the transition region electrode layers 132 have a comb-like structure. This comb-shaped structure 1321 is indicated in FIG. 2A. In accordance with this exemplary embodiment, the comb-like structure 1321 of the transition region electrode layers 132 is changed successively. As indicated in FIG. 2A, a gap between webs of the comb-like structure 1321 is varied from transition region electrode layer to transition region electrode layer. Each of the adjacent transition region electrode layers 132 together form an interdigital structure 134.

In accordance with an alternative embodiment, the transition region electrode layers 132 having a ring-like structure 1322 (FIG. 2B). The distances between the circles of the ring-like structure 1322 from the transition region electrode layer to the transition region electrode layer vary here.

Further exemplary embodiments follow from the situation in which additionally, or alternatively, to the illustrated arrangement of the terminating region 12 and the transition region 13 in the top region of the total stack 10, the terminating region 12 and the transition region are arranged in the foot region of the total stack 10.

This new piezoactuator 1 is used to operate an injection valve of an engine of a motor vehicle.

What is claimed is:

1. A piezoactuator with a monolithic multi-layered construction, comprising:
   at least one piezoelectric active partial stack, wherein the partial stack comprising piezoceramic layers arranged one above the other and electrode layers arranged between the piezoceramic layers,
   at least one piezoelectric inactive terminating region arranged above the piezoelectric active partial stack and
   at least one transition region arranged between the piezoelectric active partial stack and the terminating region, wherein
   the piezoelectric active partial stack, the terminating region and the transition region are connected with one another to form a monolithic total stack, and wherein
   the transition region comprises a transition region stack with transition region piezoceramic layers arranged one above the other and transition region electrode layers arranged between the transition region piezoceramic layers and
   the transition region piezoceramic layers and the transition region electrode layers being in a form and arranged on one another such that from transition region piezoceramic layer to transition region piezoceramic layer in the stack direction of the transition region, there is a rotation of a main axis of the poling vector and/or a rotation of a main axis of the electrical drive.

2. The piezoactuator according to claim 1, wherein the main axis in the boundary region between the transition region partial stack and the piezoelectric active partial stack essentially is aligned in parallel to the stack direction of the transition region partial stack.

3. The piezoactuator according to claim 1, wherein the rotation is caused by a change in the structure and/or a dimension of the transition region electrode layers.

4. The piezoactuator according to claim 2, wherein the structure parallel to the lateral dimension of the respective transition region electrode layer is formed like a comb.

5. The piezoactuator according to claim 4, wherein the structure parallel to the lateral dimension of the respective transition region electrode layer is shaped like a ring.

6. The piezoactuator according to claim 1, wherein adjacent transition region electrode layers form an interdigital structure.

7. The piezoactuator according to claim 1, wherein the active partial stack and/or the terminating region comprising a partial stack height selected from the range 1mm to 10mm inclusive.

8. The piezoactuator according to claim 1, wherein the transition region partial stack comprising a transition stack height selected from the range 0.2 mm to 5.0 mm inclusive.

9. The piezoactuator according to claim 1, wherein the total stack has a total stack height that is selected from the range 10mm to 200 mm inclusive.

10. The piezoactuator according to claim 1, wherein the active partial stack and/or the terminating region comprising a partial stack height selected from the range 3 mm to 5 mm inclusive.

11. The piezoactuator according to claim 1, wherein the transition region partial stack comprising a transition stack height selected from the range 0.5mm to 2.0 mm inclusive.

* * * * *